United States Patent
Pfaffinger et al.

(10) Patent No.: US 10,470,348 B2
(45) Date of Patent: Nov. 5, 2019

(54) METHOD FOR POPULATING PRINTED CIRCUIT BOARDS

(71) Applicant: Siemens Aktiengesellschaft, München (DE)

(72) Inventors: Alexander Pfaffinger, München (DE); Christian Royer, Ottobrunn (DE)

(*) Notice: Subject to any disclaimer, the term of this patent is extended or adjusted under 35 U.S.C. 154(b) by 232 days.

(21) Appl. No.: 15/517,820

(22) PCT Filed: Oct. 5, 2015

(86) PCT No.: PCT/EP2015/072898
§ 371 (c)(1),
(2) Date: Apr. 7, 2017

(87) PCT Pub. No.: WO2016/074857
PCT Pub. Date: May 19, 2016

(65) Prior Publication Data
US 2017/0311491 A1    Oct. 26, 2017

(30) Foreign Application Priority Data

Nov. 11, 2014    (DE) .................. 10 2014 222 940

(51) Int. Cl.
| H05K 13/04 | (2006.01) |
| H05K 13/00 | (2006.01) |
| H05K 13/08 | (2006.01) |

(52) U.S. Cl.
CPC ......... H05K 13/0404 (2013.01); H05K 13/00 (2013.01); H05K 13/0015 (2013.01);
(Continued)

(58) Field of Classification Search
CPC .. H05K 13/04; H05K 13/0404; H05K 13/046; H05K 13/0495; H05K 13/00;
(Continued)

(56) References Cited

U.S. PATENT DOCUMENTS

2015/0195965 A1    7/2015    Craiovan et al.

FOREIGN PATENT DOCUMENTS

| CN | 101854795 A | 10/2010 |
| CN | 102958343 A | 3/2013 |

(Continued)

OTHER PUBLICATIONS

Hashiba and Chang Computers Ind. Engineering </i> vol. 21, Nos. 1-4, pp. 453-457, 1991.*
Simulation Based Sequencing and Batch Size Analysis on a High-Mix, Low-Volumec Production System Using DMAIC a PHD dissertation by Aaron Stayer, Binghamton Univ. (New York) (2011).*

(Continued)

*Primary Examiner* — Carl J Arbes
(74) *Attorney, Agent, or Firm* — Schmeiser, Olsen & Watts, LLP

(57) ABSTRACT

Populating printed circuit boards with components on a pick-and-place variant set-up is provided. Each set-up includes a number of components, stocks of which are brought to setting-up tables on the pick-and-place line, and a set-up family is associated with each set-up, the family system, a fixed set-up and multiple printed circuit board types which can be populated using the set-up. The fixed set-up is optimized with respect to a weighted parameter, before determining, by means of a simulation, how well variant set-ups, with which the remaining components of predefined pick-and-place orders are associated, can be implemented on the setting-up tables and brought to the pick-and-place line. The quality of each different weighting is determined in order to determine an optimized weighting.

7 Claims, 2 Drawing Sheets

(52) U.S. Cl.
CPC ........... *H05K 13/08* (2013.01); *H05K 13/085* (2018.08); *H05K 13/0857* (2018.08)

(58) Field of Classification Search
CPC .. H05K 13/0015; H05K 13/08; H05K 13/085; H05K 13/0857
See application file for complete search history.

(56) References Cited

FOREIGN PATENT DOCUMENTS

| | | |
|---|---|---|
| DE | 19834620 A1 | 3/1999 |
| DE | 102012220904 A1 | 5/2014 |
| EP | 0478360 A1 | 4/1992 |
| EP | 0478361 A1 | 4/1992 |
| JP | H11177281 A | 7/1999 |
| JP | 2006171916 A | 6/2006 |
| JP | 2012134565 A | 7/2012 |
| JP | 2015531160 A | 10/2015 |
| WO | WO 2014005742 A1 | 1/2014 |

OTHER PUBLICATIONS

Component to Multi-Track Feeder Assignment and Board Sequencing for Circuit Board Assembly PHD dissertation by Yu-An Li, Oreogon State Univ. (1999).*
Planning for Cirecuit Board Assembly: The Stae of the Art Review Ji P. and Y. F. Wan International J. of Computer Applications in Technology vol. 14, Nos. 4/5/6 pp. 136-144 (2001)</i>.*
Simulation-Based Methodolgy for the Design of World-Class Manufacturing Cells, PhD Dissertation by M. L. Irizarry N.C. State Univ. (1996).*
Optimizing PCB assembly for family setup strategy, Wu, Y et al (Assembly Automation</i> 29/1 (2009) pp. 61-67.*
Group set-up for printed circuit board assembly, Carmon, T. F. et al Int. J. Prod. Res.., 1989, vol. 27, 1795-1810.*
International Search Report for PCT Application No. PCT/EP2015/072898, dated Feb. 22, 2016.
Chinese Office Action for application No. 201580061358.8 (PCT/EP2015/072898) dated Apr. 1, 2019.

* cited by examiner

METHOD FOR POPULATING PRINTED CIRCUIT BOARDS

CROSS-REFERENCE TO RELATED APPLICATIONS

This application claims priority to PCT Application No. PCT/EP2015/072898, having a filing date of Oct. 5, 2015, based off of German application No. DE 102014222940.5 having a filing date of Nov. 11, 2014, the entire contents of which are hereby incorporated by reference.

FIELD OF TECHNOLOGY

The following relates to a method and a system for populating printed circuit boards. A pick-and-place line that is designed for populating printed circuit boards with components is also related.

BACKGROUND

An electronic assembly comprises a printed circuit board and components that are mechanically and electrically fastened to it. To manufacture the printed circuit board, the components are placed on the printed circuit board by a pick-and-place machine, after which they are soldered to it in a reflow oven. Multiple pick-and-place machines can operate at a pick-and-place line one after another. A pick-and-place system that comprises a plurality of pick-and-place lines can be used for the manufacture of a large number of printed circuit boards.

Stocks of components of predetermined component types are brought to setting-up tables at a pick-and-place line. If a printed circuit board is to be populated, for which not all the components are present at one of the attached setting-up tables, the setting-up tables are swapped for other setting-up tables which have been furnished for this purpose with the required components. The number of available setting-up tables is usually limited, and furnishing a setting-up table with components of a component type can be costly. A fixed set-up can therefore be formed which remains attached to one or a plurality of setting-up tables, unchanged over a relatively long planning horizon.

DE 10 2012 220 904 A1 relates to a method for determining a fixed set-up for a pick-and-place line.

SUMMARY

A pick-and-place line for the fixed set-up may be determined as far as possible in such a way that variant set-ups to which the remaining component types of predetermined population orders are assigned can be set up efficiently at the pick-and-place line. Embodiments of the invention include providing an improved technique for improved population of printed circuit boards.

A set-up is made available at a pick-and-place line, wherein a set-up family that comprises a plurality of printed circuit board types is associated with the set-up, and wherein component types are associated with the set-up so that a printed circuit board of a printed circuit board type of a set-up family can be populated by means of components of the component types of the set-up. A first planning period is specified for this purpose, and is divided into a plurality of second planning periods. Each set-up can be implemented at one or a plurality of setting-up tables through the provision of stocks of components of the associated component types. The set-ups here are divided into fixed set-ups and variant set-ups, wherein a fixed set-up is configured to remain implemented unchanged on one or a plurality of setting-up tables during the first planning period, and a variant set-up is configured to be implemented only temporarily at one or a plurality of setting-up tables during a second planning period.

A method for populating printed circuit boards by means of a pick-and-place line comprises steps of (a) the registration of orders, each for populating a piece count of printed circuit boards of a printed circuit board type with components associated with component types in a predetermined second planning period, (b) the association of component types with fixed set-ups on the basis of all orders, (c) the optimization of the association with reference to the maximization of a weighted combination of a production volume and a number of orders, (d) performing, for each second planning period, an association of component types with variant set-ups on the basis of orders of the respective second planning period and the determination of a sequence in which fixed set-ups or variant set-ups should be set up at the pick-and-place line in order in each case to process an order; furthermore (e) the determination of a criterion that comprises the qualities of the determined sequences of all the second planning periods, (f) the repetition of steps (b) to (e) with a changed weighting of the combination, (g) the determination of an optimized weighting at which the criterion is optimized, and (h) the population of printed circuit boards by means of a set-up that has been determined on the basis of the optimized weighting.

It is possible in particular to determine through the method which weighting allows a fixed set-up to be determined for the pick-and-place line that leads to variant set-ups that can easily be handled at the pick-and-place line. This can, for example, be useful for determining a fixed set-up for a subsequent first planning period for which not all the orders are yet known. It is thus possible on the basis of historical or statistical order data to determine a fixed set-up which, with a high probability, again leads to effectively usable variant set-ups. It is recognized in accordance with embodiments of the invention that the optimization of the association of components with the fixed set-up in terms of the weighted combination of the production volume and the number of orders must be optimized. Through the determination of the optimized weighting, a good compromise between the two target criteria which, under certain circumstances, can conflict with one another in terms of the formation of the fixed set-up, can be found.

The criterion for the assessment of the quality of the determined sequences in the second planning periods can be chosen differently. The criterion can thus be adjusted to the requirements or technical features of the pick-and-place line or of the orders.

In one form of embodiment, the criterion comprises the minimization of a downtime. The downtime occurs when the population at the pick-and-place line by means of a first set-up is completed before a second set-up, following it in sequence, has been made ready. Expressed otherwise, a downtime can arise if not enough time remains in advance to implement the second set-up. Since the procurement and operation of the pick-and-place line can be associated with considerable costs, the avoidance or minimization of downtimes is of particular interest.

The production volume can be given extra weighting in order to reduce the downtimes. If, for example, it is found that the criterion is suboptimum, because the downtimes are unsatisfactorily long, the weighting of the combination can be specifically shifted in the direction of the production volume.

In a further form of embodiment, the criterion comprises a minimization of a number of variant set-ups. The fewer variant set-ups that have to be implemented, the smaller can be a setting-up expense, so that the variant set-ups can be brought into an improved sequence.

In one variant, the production volume is given reduced weighting in order to reduce the number of variant set-ups. Preferably, the weighting of the production volume is only reduced as far as necessary for the downtimes to remain below an acceptable threshold. This threshold can, for example, be located at zero. In yet another form of embodiment, the criterion comprises the minimization of a number of setting-up procedures. A setting-up procedure here comprises the procedure of furnishing at least one setting-up table with a stock of components of a component type that is assigned to a variant set-up. The less often setting-up procedures have to be carried out, the more time may be available for the preparation of a set-up.

In a further form of embodiment, the criterion comprises the minimization of a number of set-up changes from a first set-up to a second set-up at the pick-and-place line.

In a further form of embodiment, the criterion can also comprise a weighted combination of a plurality of the said factors. The results achievable with the method can be improved in this way.

It is furthermore preferred for the steps b.) to e.) to be repeated until the criterion has achieved a predetermined quality, or until a predetermined processing time has elapsed. If an acceptable quality of the criterion could not be achieved within the predetermined processing time, it is possible for the acceptance threshold for the criterion to be changed, or for a parameter that affects the running time of the method to be changed. The furnishing of the pick-and-place line can, for example, be changed, in order to enable a further improvement of the criterion.

The weighted combination can also be extended. In particular, the combination can be extended by a constituent that comprises the total of the number of component types, that are associated with fixed set-ups, multiplied by the associated number of orders. Different or additional constituents are also possible.

It is particularly preferred that at least step c.) is performed by means of a mixed integer program. The mixed integer programming can, with the help of a computer, ensure high-quality optimization results.

A computer program product comprises program code means for carrying out the method described above when the computer program product runs on a processing apparatus or is stored on a computer-readable medium.

A system for populating printed circuit boards comprises a pick-and-place line and a processing apparatus for carrying out the method described above.

BRIEF DESCRIPTION

Some of the embodiments will be described in detail, with reference to the following figures, wherein like designations denote like members, wherein.

DETAILED DESCRIPTION

Figure 1:
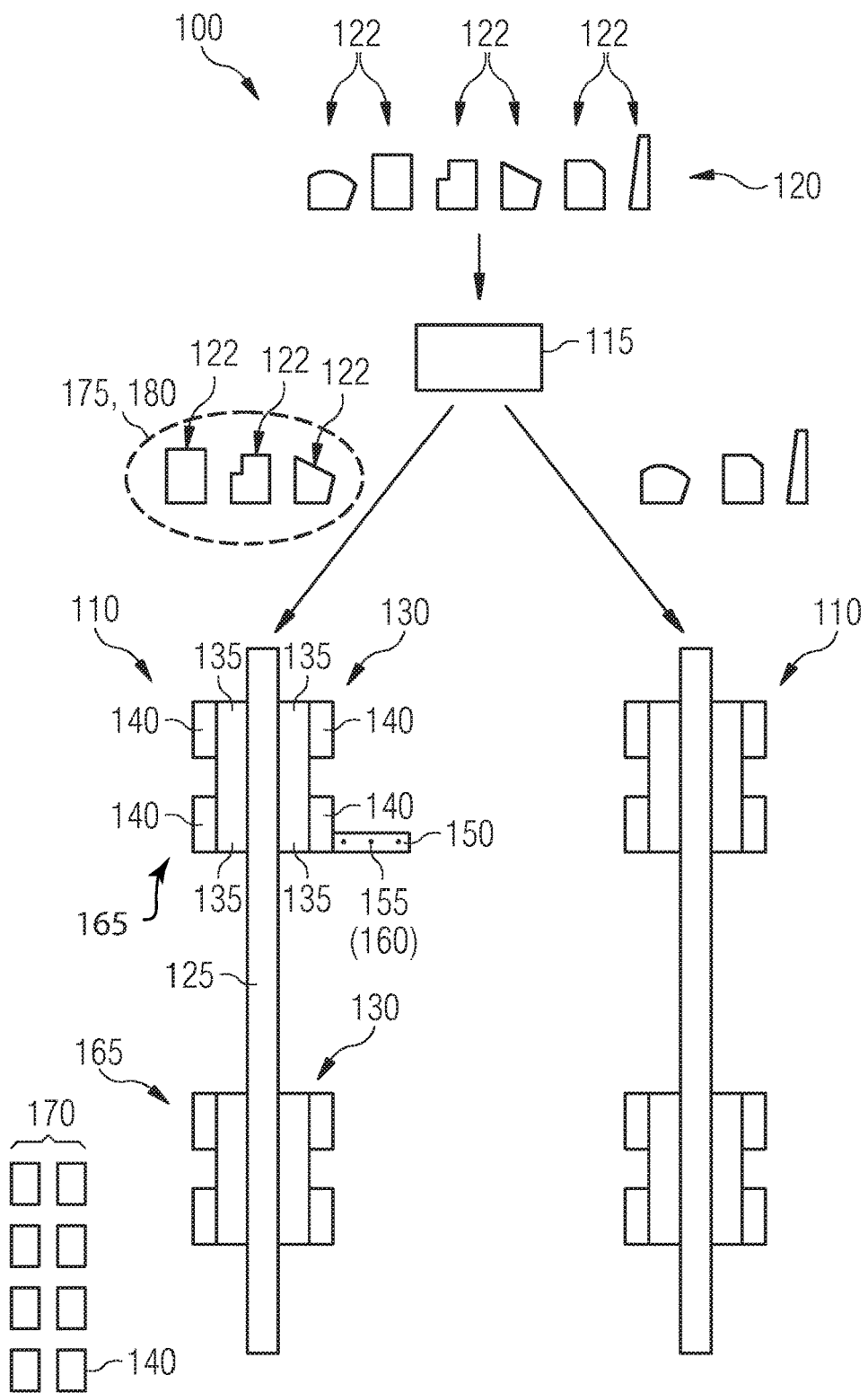
FIG. 1 shows a pick-and-place system, in accordance with embodiments of the present invention.

FIG. 1 shows an exemplary pick-and-place system 100. The pick-and-place system 100 comprises one or a plurality of pick-and-place lines 110 and a processing or control apparatus 115. Each pick-and-place line 110 comprises an optional transport system 125 as well as one or more pick-and-place machines 130. Each pick-and-place machine 130 comprises one or a plurality of pick-and-place heads 135, each of which is designed to pick up a component 155 from a setting-up table 140 and to position it at a predetermined position on the printed circuit board 120, which is located on the transport system 125. The printed circuit board 120 normally remains stationary with respect to the pick-and-place machine 130 during the population process.

The setting-up tables 140 usually comprise a plurality of feed apparatuses 150, of which only one is illustrated by way of example in FIG. 1. Each feed apparatus 150 holds ready a stock of components 155 of a predetermined component type 160. The feed apparatus 150 usually has a capacity, which can be expressed in tracks, for the components 155. One track is usually 8 mm wide, and the number of tracks of a setting-up table 140 is restricted, for example to 40. Components 155 of the same component type 160 are usually made available in a belt, on a tray or in a tube.

Each component type 160 requires a predetermined number of tracks at the feed apparatus 150 and at the setting-up table 140, which are usually adjacent to one another. For the sake of simplicity, the number of components 155 of one component type 160 in a feed apparatus 150 is thought of here as practically limitless, so that subsequent restocking is not necessary. A feed apparatus 150 can usually be configured to hold ready components 155 of different component types 160, and it is usually possible for different feed apparatuses 150 to be attached to a setting-up table 140.

If a component 155 of one component type 160 that is not present at one of the setting-up tables 140 is required at the pick-and-place machine 130, the association of components 155 with one of the attached setting-up tables 140 is not usually changed, but the setting-up table 140 is instead exchanged completely for a different, appropriately furnished, setting up table 140.

A set-up 165, 170 comprises a quantity of component types 160, and is implemented by means of one or a plurality of setting-up tables 140, each of which is furnished with stocks of components 155 of the component types 160 of the set-up 165, 170, in order to be attached to the pick-and-place line 110. It is possible here to distinguish between fixed set-ups 165 and variant set-ups 170. A fixed set-up 165 is provided to remain loaded in an unchanged manner on the setting-up table or tables 140 over a predetermined planning horizon, while a variant set-up 170 is configured to remain loaded only temporarily within the planning horizon at one or a plurality of setting-up tables 140. The planning horizon can, for example, be up to about 10 days. A time over which a variant set-up 165 is implemented at one or a plurality of setting-up tables 140 is usually significantly shorter than the planning horizon. This time can, for example, be several hours or days, but is however not usually longer than one week.

A set-up family 175, 180 comprises a number of printed circuit board types 122, and is associated with precisely one set-up 156, 170, and vice versa. It is possible to distinguish here between a fixed set-up family 175 and a variant set-up family 180. A fixed set-up family 175 is associated with a fixed set-up 165, and comprises printed circuit board types 122 whose associated printed circuit boards 120 can be fully populated with components 155 of component types 160 of the associated fixed set-up 165. Similarly, a variant set-up family 180 is associated with a variant set-up 170, and comprises printed circuit board types 122 whose associated printed circuit boards 120 can be fully populated with components 155 of component types 160 of the associated variant set-up 170.

During operation of the pick-and-place line 110, various set-ups 165, 170 are attached one after another to the pick-and-place line 110, in order to populate respectively assigned printed circuit boards 120. A change in the set-ups 165, 170 at the pick-and-place line 110 is referred to as a set-up change, and usually requires a downtime of the pick-and-place line 110.

In order to implement a fixed set-up 165 or a variant set-up 170, one or more setting-up tables 140 are usually loaded with stocks of components 155 of predetermined component types 160 when not attached to the pick-and-place line 110. Components 155 that have already been set up of component types 160 that are not required can be first dismounted or can remain set up. This process is called preliminary setting up, and can require a processing time in the range of one or a plurality of hours, for example about 6-10 hours.

In order to minimize the effort, that is associated with a variant set-up 170, of setting up and dismounting as well as of changing the set-up, an attempt is usually made to accommodate as many printed circuit board types 122 as possible in fixed set-ups 165. The desired case without variant set-ups 170 is, however, scarcely achievable in practice.

The way in which the set-up families 175, 180 or the set-ups 165, 170 are composed is critical for the operation of the pick-and-place line 110. It may be necessary to observe secondary constraints in their formation, such as the maintenance of a limited capacity of a setting-up table 140 for component types 160, or a grouping of predetermined printed circuit board types 160 in the same set-up family 175, for reasons such as the use of solder that does or does not contain lead.

The formation of set-up families 175, 180 or of set-ups 165, 170 can be achieved by means of the control apparatus 115. The control apparatus 115 can, in addition, determine a sequence in which the set-ups 165, 170 should be set up at the pick-and-place line 110. The control apparatus 115 can, furthermore, control the population at a pick-and-place line 110 or the entire pick-and-place system 100.

Figure 2:
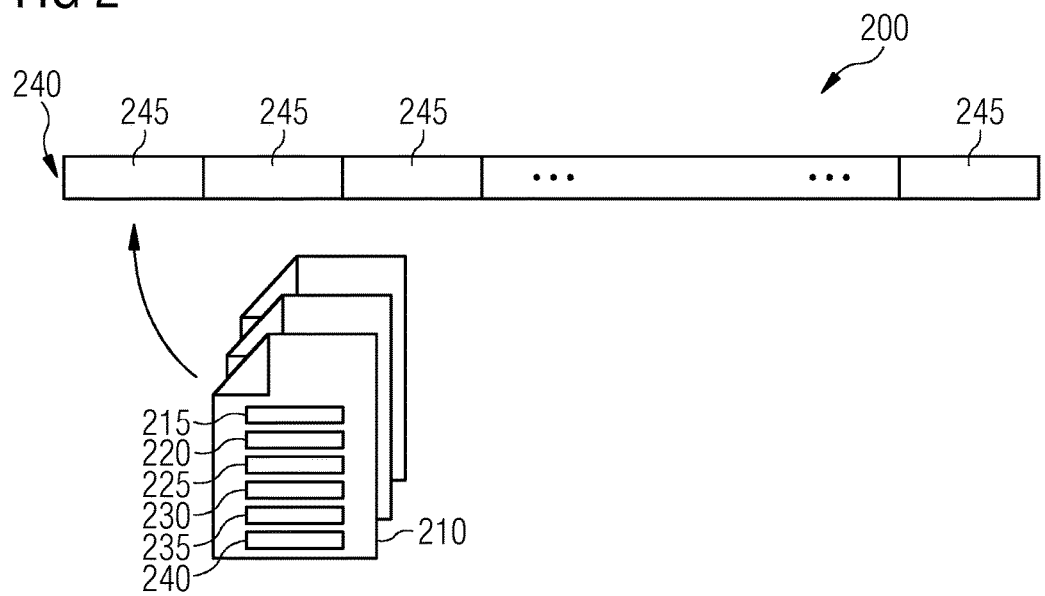
FIG. 2 shows a flow diagram of a method for determining a fixed set-up for the pick-and-place line of the pick-and-place system of FIG. 1, in accordance with embodiments of the present invention.

FIG. 2 shows a flow diagram of a method 200 for determining a sequence of set-ups at a pick-and-place line 110 of the pick-and-place system 100 of FIG. 1.

An order 210 is present for the population of printed circuit boards 120 of a printed circuit board type 122 on a pick-and-place line. The order 210 usually comprises at least the printed circuit board type 122 and a piece count 215 of the printed circuit boards 120 that are to be populated. One or a plurality of component types 160, of which in each case one or a plurality of components 155 are to be populated, are associated with the printed circuit board type 122.

Further information can in addition be associated with the printed circuit board type 122. For example, a number 220 of component types 160 with which every printed circuit board 120 is to be populated, a number 225 of population positions of a printed circuit board 120, or a production time 230 for a printed circuit board 120 may be given. The number 225 of the population positions usually corresponds to the number of components 155 with which a printed circuit board 120 of the printed circuit board type 122 are to be populated, regardless of which component type 160 is concerned.

A priority 235 can be associated with an order 210, stating the urgency with which the order 210 is to be executed.

A large number of orders 210 are present for a first planning period 240, which is subdivided into a plurality of second planning periods 245. The first planning period can, for example, extend over several months or a year. The second planning period can, for example, extend over one or a plurality of days or over one or a few weeks. Usually all the second planning periods 245 are of the same length, and preferably are immediately adjacent to one another. In one form of embodiment, the first planning period 240 extends over at least 20 second planning periods 245.

One or a plurality of orders 210 are associated with each second planning period 245. If an order 210 cannot be finished within the second planning period 245 that has been associated with it, it can, under certain circumstances, be postponed into a subsequent second planning period 245. The priority of the order 210 can in this case be raised.

The method 200 determines a fixed set-up 165 for the orders of the first planning period 240, and at least one variant set-up 170 for each second planning period 245. In order to determine the fixed set-up 165 as far as possible in such a way that the variant set-ups 170 can easily be managed in the setting-up operation of the pick-and-place line 110, the fixed set-up 165 is optimized with reference to a weighted combination of a production volume and a number of orders.

The number of orders corresponds to the number of orders 210 that can be populated by means of the fixed set-up 165. The production volume corresponds to the total of the production times of the orders 210 that are included in the number of orders.

A weighted combination can, for example, comprise a total of the product from the number of orders with a first weighting factor and a product of the production volume and a second weighting factor. If one of the weighting factors is increased, the other is preferably reduced at the same time. The total of the factors can, for example, always yield a predetermined constant, in particular 1.

The association of the printed circuit board types 122 with the fixed set-up 165 is preferably optimized with methods of linear optimization. Linear optimization is the basis of the method for solving (mixed) integer linear optimization (MIP: Mixed Integer Programming). A range of good, commercial, standard solvers (Ilog, Gurobi, Xpress), which are in wide practical use and are well-proven, are available for handling concrete problems by means of MIP. The weighted combination of the product volume and of the number of orders is given here as the optimization criterion.

An evaluation is then made, preferably by means of simulation, of what effects the fixed set-up 165 that has been determined has on the operation of the pick-and-place line 110. Variant set-ups 170 are formed for this purpose for each second planning period 245, so that the orders 210 whose production time 230 falls in the respective second planning period 245 can be processed on the pick-and-place line 110.

As is described in more detail below with reference to FIG. 3, a sequence at the pick-and-place line 110 of fixed set-ups 165 and/or variant set-ups 170 is preferably then determined. After this, a criterion is determined that comprises the qualities of the sequences that have been determined for all the second planning periods 245. The criterion can, for example, comprise the minimization of a downtime of the pick-and-place line 110. As described above, other or combined criteria are also possible. The criterion preferably depends on the fixed set-up or set-ups 165 that have been determined, whose formation depends on the weighting of the combination of the product volume and of the number of orders. In order to provide an optimized criterion, the steps referred to above can be repeated with a changed weighting of the combination of the product volume and the number of orders. Preferably the steps are carried out as often as possible with different weightings, in order to find the particular weighting that permits an optimized formation of variant set-ups 170.

The printed circuit boards 120 can then be populated by means of a set-up 165, 170 that has been determined on the basis of the optimized weighting.

The weighting that has been determined for the determination of fixed set-ups 165 can furthermore be adopted for a further first planning period 240 that follows directly after the first planning period 240 referred to above. The weighting can reflect the actual relationships at the pick-and-place line 110, so that it permits an improved formation of variant set-ups 170 in the second planning period 145 of the further first planning period 240.

Figure 3:
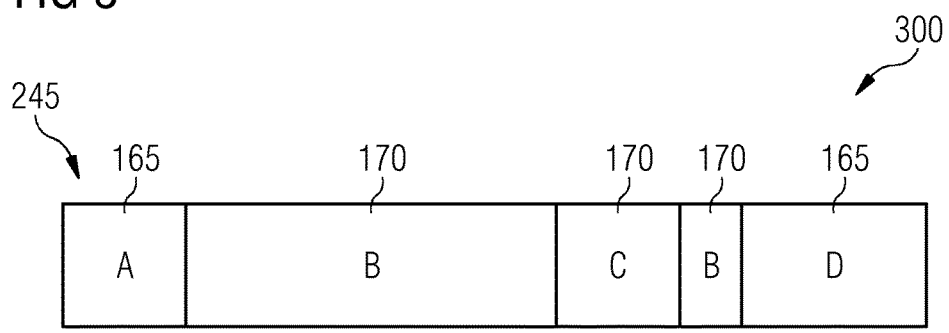
FIG. 3 shows an exemplary sequence of set-ups at a pick-and-place line of the pick-and-place system of FIG. 1, in accordance with embodiments of the present invention.

FIG. 3 shows an exemplary sequence 300 of set-ups 165, 170 at a pick-and-place line 110 of the pick-and-place system 100 of FIG. 1. The set-ups A-B-C-B-D are set up one after another within an exemplary second planning period 245. The set-ups A and D here are fixed set-ups 165, and the set-ups B and C are variant set-ups 170.

While the fixed set-up A is set up at the pick-and-place line 110, setting-up tables 140 can be set up with the variant set-up B. When all the printed circuit boards 120 that can be fitted by means of the fixed set-up 165 have passed through the pick-and-place line 110, a set-up change to the variant set-up B is performed. The variant set-up C can be prepared while population is being performed using the variant set-up B. If enough setting-up tables 140 are present, it is possible to make a start on the implementation of variant set-up C while the fixed set-up A is still available at the pick-and-place line 110.

Set-up changes to variant set-up B and then to fixed set-up D are then carried out in the manner described. A fixed set-up A or D is preferably inserted in the sequence 300 between two variant set-ups B or C if the implementation of the set-up of the temporally later variant set-up B or C runs the risk of taking up more time than that of the production duration by means of the temporally earlier variant set-up B or C. The precise consequences of the sequence 300 in respect of the fixed set-ups A and D that have been determined and of the variant set-ups B and C that have been determined can be quantified in different ways. We refer to the description of FIG. 2 in respect of the determination of a criterion that reflects the quality of the sequence 300 of one or more second planning periods 245.

Although the invention has been more closely illustrated and described in detail through the preferred exemplary embodiment, the invention is not restricted by the disclosed examples, and other variations can be derived from this by the expert without leaving the scope of protection of the invention.

The invention claimed is:

1. A method for populating printed circuit boards by means of a pick-and-place line, at which a set-up is made available;

wherein a set-up family that comprises a plurality of printed circuit board types is associated with the set-up, wherein component types are associated with the set-up, so that a printed circuit board of a printed circuit board type of a set-up family can be populated by means of components of the component types of the set-up;

wherein a first planning period is specified, and is divided into a plurality of second planning periods;

wherein each set-up can be implemented at one or a plurality of setting-up tables through the provision of stocks of the components of the associated component types;

wherein the number of available setting-up tables is limited;

wherein the set-ups are divided into fixed set-ups and variant set-ups, wherein a fixed set-up is configured to remain implemented unchanged on one or a plurality of setting-up tables during the first planning period, and a variant set-up is configured to be implemented only temporarily at the one or a plurality of setting-up tables during a second planning period, the method comprising:

a) registering orders, each for populating a piece count of the printed circuit boards of the printed circuit board type with the components associated with the component types in a predetermined second planning period;

b) associating the component types with the fixed set-ups on the basis of all orders, wherein a fixed set-up family is associated with a fixed set-up, which fixed set up family comprises the printed circuit boards whose associated printed circuit boards can be fully populated with components of component types of the associated fixed set-up;

c) optimizing the association with reference to a maximization of a weighted combination of a production volume and a number of orders, wherein the number of orders corresponds to the number of orders that can be populated by means of the fixed set-up, wherein the production volume corresponds to the total of the production times of the orders that are included in the number of orders, and wherein the weighted combination comprises a total of the product of the number of orders with a first weighting factor and a product of the production volume and a second weighting factor;

d) for each second planning period:
  associating the component types with the variant set-ups on the basis of orders of the respective second planning period;
  determining a sequence in which the fixed set-ups or the variant set-ups should be set up at the pick-and-place line in order in each case to process the order;

e) determining a criterion that comprises the qualities of the determined sequences of all the second planning periods, wherein the criterion is based on the determined sequences of all the second planning periods, and comprises at least one of a minimization of a downtime, of a number of variant set-ups, of a number of setting-up procedures, of a number of set-up changes, or a weighted combination thereof;

f) determining an optimed weighting at which the criterion is optimized by repeating steps b.) to e.) with a changed weighting of the combination, wherein the steps b.) to e.) are repeated until the criterion has achieved a predetermined quality, or until a predetermined processing time has elapsed g) ; and populating the printed circuit boards by means of the set-up that has been determined on the basis of the optimized weighting.

2. The method as claimed in claim 1, wherein the production volume is given extra weighting in order to reduce the downtimes.

3. The method as claimed in claim 1, wherein the production volume is given reduced weighting in order to reduce the number of variant set-ups.

4. The method as claimed in claim 1, wherein the weighted combination additionally comprises a constituent for the total of the number of component types, that are associated with the fixed set-ups, multiplied by the number of orders.

5. The method as claimed in claim 1, wherein step c.) is performed by means of a mixed integer program.

6. A computer program product with program code means for carrying out the method as claimed in claim 1, when the computer program product runs on a processing apparatus or is stored on a computer-readable medium.

7. A system for populating printed circuit boards, comprising:
- a pick-and-place line; and
- a processing apparatus for carrying out the method as claimed in claim 1.

* * * * *